United States Patent [19]

Yang

[11] Patent Number: 5,372,955

[45] Date of Patent: Dec. 13, 1994

[54] METHOD OF MAKING A DEVICE WITH PROTECTION FROM SHORT CIRCUITS BETWEEN P AND N WELLS

[75] Inventor: Ming-Tzong Yang, Hsin Chu, Taiwan, Prov. of China

[73] Assignee: United Microelectronics Corporation, Hsinchu, Taiwan, Prov. of China

[21] Appl. No.: 100,306

[22] Filed: Aug. 2, 1993

[51] Int. Cl.$^5$ .......................................... H01L 21/266
[52] U.S. Cl. ........................................ 437/34; 437/74; 437/148; 148/DIG. 70
[58] Field of Search ..................... 437/29, 30, 34, 56, 437/57, 58, 74, 148; 148/DIG. 70; 257/371, 372

[56] References Cited

U.S. PATENT DOCUMENTS

| 4,912,054 | 3/1990 | Tomassetti | 437/74 |
| 5,106,769 | 4/1992 | Matsumi | 437/34 |
| 5,208,171 | 5/1993 | Ohmi | 437/34 |

OTHER PUBLICATIONS

S. M. Sze, "VLSI Technology", published by McGraw-Hill International–Singapore, 1988, pp. 486–491.

*Primary Examiner*—Brian E. Hearn
*Assistant Examiner*—Chandra Chaudhari
*Attorney, Agent, or Firm*—George O. Saile; Graham S. Jones, III

[57] ABSTRACT

A method of manufacture of a MOSFET device with a predetermined light positive or negative doping comprises forming a first mask upon said substrate. Dopant of a predetermined positive or negative variety is implanted through the mask. A second mask is formed over the openings in the first mask. The first mask is removed. Dopant of the opposite positive or negative variety is implanted into the openings in the second mask. The process forms a pattern of positive and negative wells in the substrate, and forms a guard ring of an opposite doping variety from the wells being protected formed in the substrate.

18 Claims, 4 Drawing Sheets

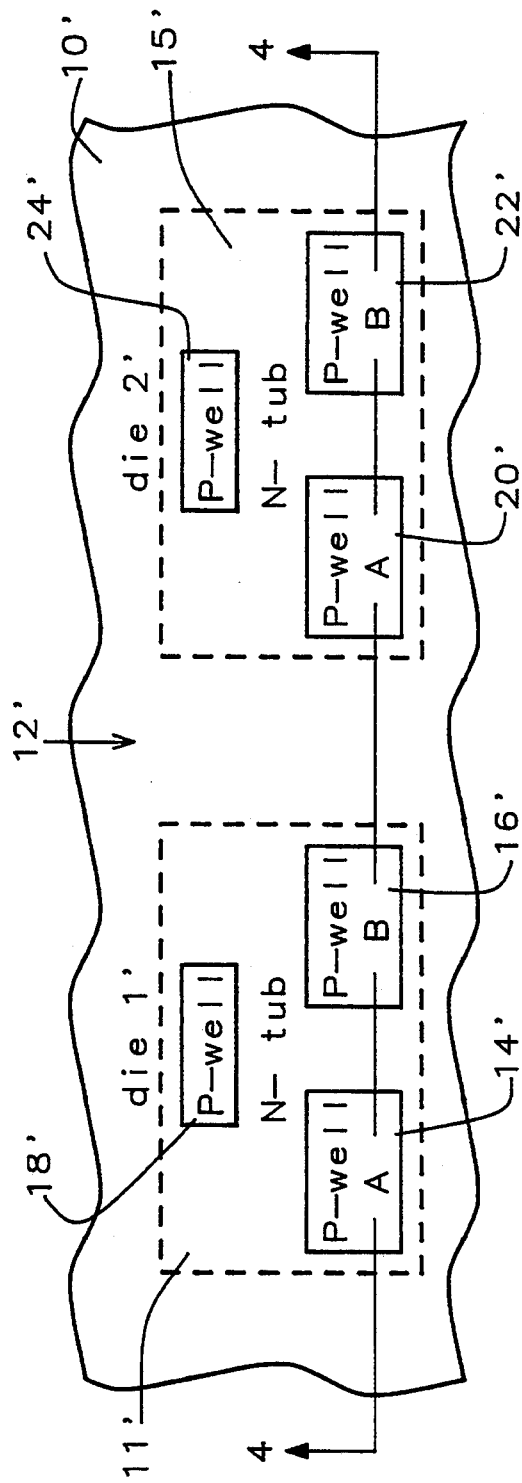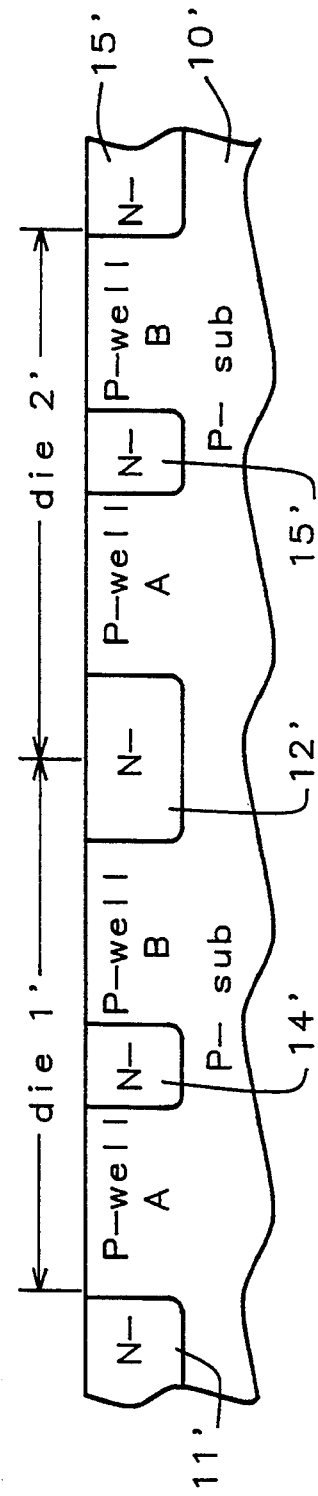
FIG. 3
FIG. 4

5,372,955

METHOD OF MAKING A DEVICE WITH PROTECTION FROM SHORT CIRCUITS BETWEEN P AND N WELLS

BACKGROUND OF THE INVENTION

1. Field of the Invention

This invention relates to MOSFET devices and more particularly to well structures therein.

2. Description of Related Art

A process for forming P and N well and tub structures in VLSI devises is described in Sze, VLSI Technology, McGraw Hill Book Company, pages 486-491 (1988).

An object of this invention is to provide protection from shorts when there is a change in a process of manufacture or when two different wells of the N variety and the P variety products are combined in the same die.

SUMMARY OF THE INVENTION

In accordance with this invention a method and a structure formed by a method in accordance with this invention are provided. A MOSFET device is manufactured with a predetermined light positive or negative doping including forming a first mask upon the substrate, implanting dopant material of a predetermined positive or negative variety through the mask, forming a second mask over the openings in the first mask, removing the first mask, implanting dopant material of the opposite variety into the openings in the second mask, the process forming a pattern of positive and negative wells in the substrate, and forming a guard ring of an opposite doping from the wells being protected formed in the substrate, whereby the guard ring protects against short circuits when two wells of opposite varieties are juxtaposed in a single substrate.

In accordance with this invention, is provided for manufacturing a MOSFET device with a predetermined light positive or negative doping comprising the following steps: forming a first mask upon the substrate, implanting dopant material of a predetermined positive or negative variety through the mask, forming a second mask over the openings in the first mask, removing the first mask, implanting dopant material of the opposite variety into the openings in the second mask, the process forming a pattern of positive and negative wells in the substrate, and forming a guard ring of an opposite doping from the wells being protected formed in the substrate, whereby the guard ring protects against short circuits when two wells of opposite varieties are juxtaposed in a single substrate.

Preferably, the guard ring is formed by ion implantation of a dopant material into the substrate.

Preferably, the chemical species of the dopant material implanted is boron or the chemical species of the dopant material implanted is phosphorous and the implantation is performed with a dose of between about $1E12$ $cm^{-2}$ and about $1E14$ $cm^{-2}$, an energy of between about 40 keV and about 500 keV.

In another aspect of the invention, a method of manufacture of a MOSFET device with a predetermined light negative doping comprises forming a first mask upon the substrate, implanting dopant material of a positive variety through the mask, forming a second mask over the openings in the first mask, removing the first mask, implanting dopant material of the negative variety into the openings in the second mask the process forming a pattern of positive and negative wells and tubs in the substrate, and forming a guard ring of a positive variety doping protecting the wells within the tubs. Preferably, the guard ring is formed by ion implantation of a dopant material into the substrate; the chemical species of the dopant material implanted is boron or the chemical species of the dopant material implanted is phosphorous, and the implantation is performed with a dose of between about $1E12$ $cm^{-2}$ and about $1E14$ $cm^{-2}$, at an energy of between about 40 keV and about 500 keV.

In another aspect of this invention a method of manufacture of a MOSFET device with a predetermined light negative doping comprises forming a first mask upon the substrate, implanting dopant material of a negative variety through the mask, forming a second mask over the openings in the first mask, removing the first mask, implanting dopant material of the positive variety into the openings in the second mask, the process forming a pattern of positive and negative wells and tubs in the substrate, and forming a guard ring of a negative variety doping protecting the wells within the tubs. Preferably, the guard ring is formed by ion implantation of a dopant material into the substrate; the chemical species of the dopant material implanted is boron, or the chemical species of the dopant material implanted is phosphorous; and the implantation is performed with a dose of between about $1E12$ $cm^{-2}$ and about $1E14$ $cm^{-2}$, an energy of between about 40 keV and about 500 keV.

A MOSFET device with a predetermined light positive or negative doping made by the process comprising: forming a first mask upon the substrate, implanting dopant material of a predetermined positive or negative variety through the mask, forming a second mask over the openings in the first mask, removing the first mask, implanting dopant material of the opposite positive or negative variety into the openings in the second mask the process forming a pattern of positive and negative wells in the substrate, and forming a guard ring of an opposite doping from the wells being protected formed in the substrate.

A MOSFET device with a predetermined light negative doping made by the process comprising as follows: forming a first mask upon the substrate, implanting dopant material of a positive variety through the mask, forming a second mask over the openings in the first mask, removing the first mask, implanting dopant material of the negative variety into the openings in the second mask, the process forming a pattern of positive and negative wells and tubs in the substrate, and forming a guard ring of a positive variety doping protecting the wells within the tubs.

A MOSFET device with a predetermined light negative doping made by the process comprising: forming a first mask upon the substrate, implanting dopant material of a negative variety through the mask, forming a second mask over the openings in the first mask, removing the first mask, implanting dopant material of the positive variety into the openings in the second mask, the process forming a pattern of positive and negative wells and tubs in the substrate, and forming a guard ring of a negative variety doping protecting the wells within the tubs.

BRIEF DESCRIPTION OF THE DRAWINGS

The foregoing and other aspects and advantages of this invention are explained and described below with reference to the accompanying drawings, in which:

FIG. 3 is a plan view of a variation in the process of FIG. 1.

FIG. 4 is a sectional view taken along line 4—4 in FIG. 3 which shows the obvious differences from FIG. 2.

DESCRIPTION OF THE PREFERRED EMBODIMENT

Figure 1:
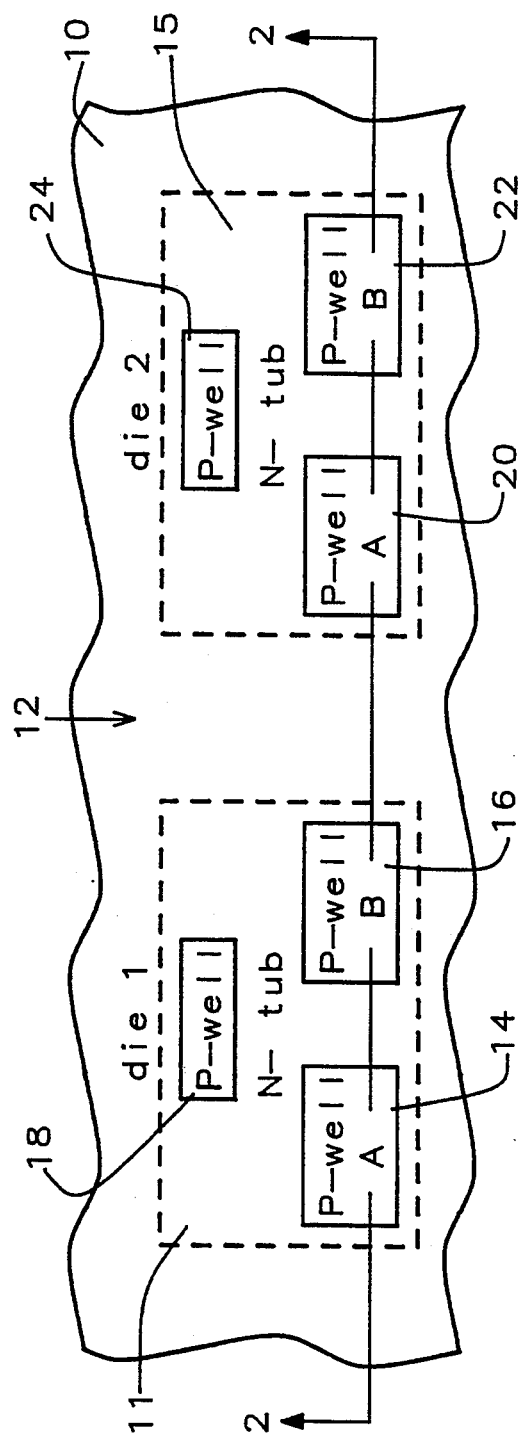
FIG. 1 shows, in a MOSFET fabrication process, an arrangement of two adjacent dies having N- tubs on a P- substrate separated by an N- well.

FIG. 1 shows, in a MOSFET fabrication process, an arrangement of two adjacent dies having N- tubs 11 and 15 on a substrate 10 separated by an N- well 12. In this case substrate 10 is doped N-. A group of P- wells 14, 16, 18 in tub 11 in die 1 and 20, 22, and 24 in N- tub 15 of die 2 are formed in the substrate 10.

Figure 2:
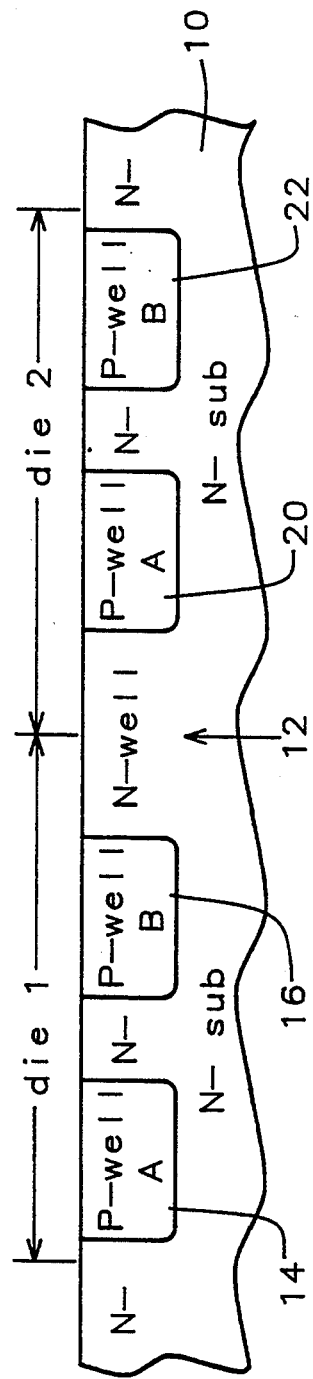
FIG. 2 shows a section taken along line 2—2 in FIG. 1.

FIG. 2 shows a section taken along line 2—2 in FIG. 1. As viewed in FIG. 1, the P- wells 14, 16, 18, 20, 22, and 24 are all isolated and the N- tubs 11, 12 and 15 of N- substrate 10 are common. The same is true in the case of FIG. 2. If a P- well in die 1 is shorted to the N- substrate, then die 1 fails but die 2 is not shorted because each P- well is isolated within its tub 11 or 15.

FIG. 3 is a plan view which appears to be identical to the view shown in FIG. 1, but as can be seen in FIG. 4, the sectional view is different from the sectional view in FIG. 2. If we change the substrate from an N- sub to P- sub the layouts (plan views) of FIGS. 1 and 3 are the same, but the cross sections of FIGS. 2 and 4 are different.

FIGS. 3 and 4 are analogous to FIGS. 1 and 2 with the exception that the substrate 10' is doped P- instead of N- and N- tubs 11' and 15' are formed within the surface of the P- substrate 10. Tub 11' surrounds the P- wells 14', 16', 18' in die 1 and tub 15' surrounds the P- wells 20', 22', and 24' in die 2. As viewed in FIG. 3, which is the top view, the P- wells 14', 16', 18', 20', 22', and 24' are all isolated and the N- tubs 11' and 15' and 12' are shown to be common.

The opposite appears to be true in the case of FIG. 4 with the P- wells 14', 16', 20' and 22' and the P- doped section of the substrate 10' both of which are P- and which are shown to be common. The N- wells 11', 15', and 12', are shown in FIG. 4 to be isolated.

Therefore, both the P- wells and the N- tubs are common depending upon the point of view, (plan or section). In fact the result of this configuration is that if a given P- well is shorted to an N- well, then any P- well is shorted to any N- well.

Figure 5:
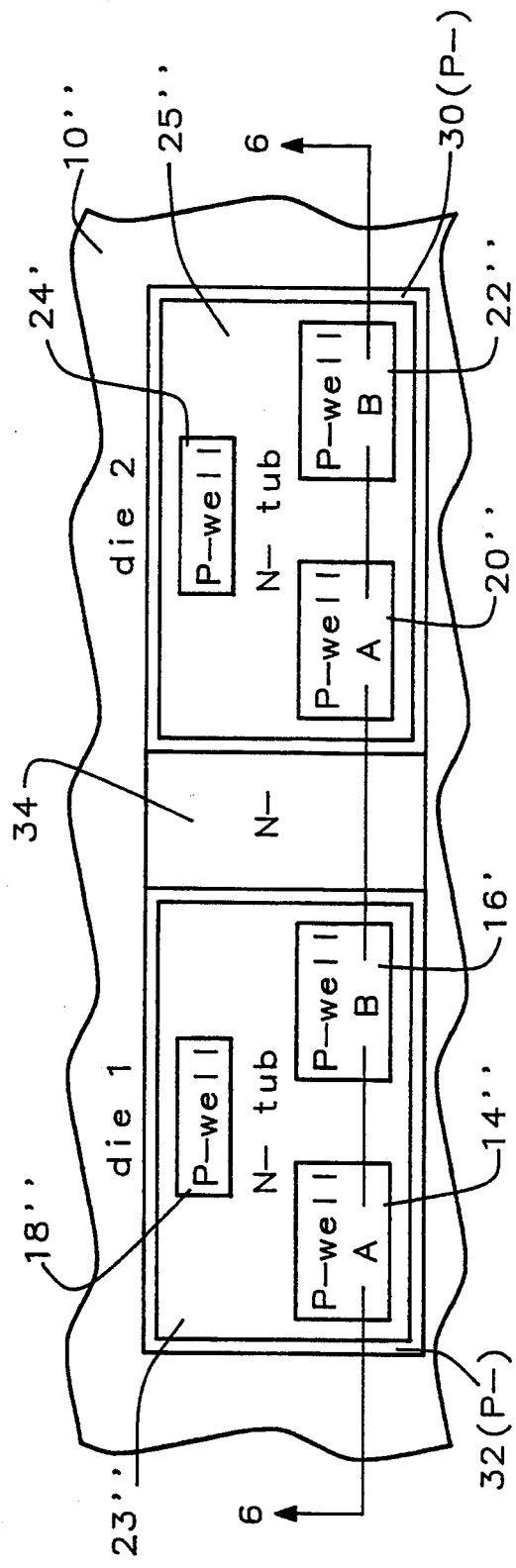
FIGS. 5 and 6 illustrate the results of a process for forming guard rings.
Figure 6:
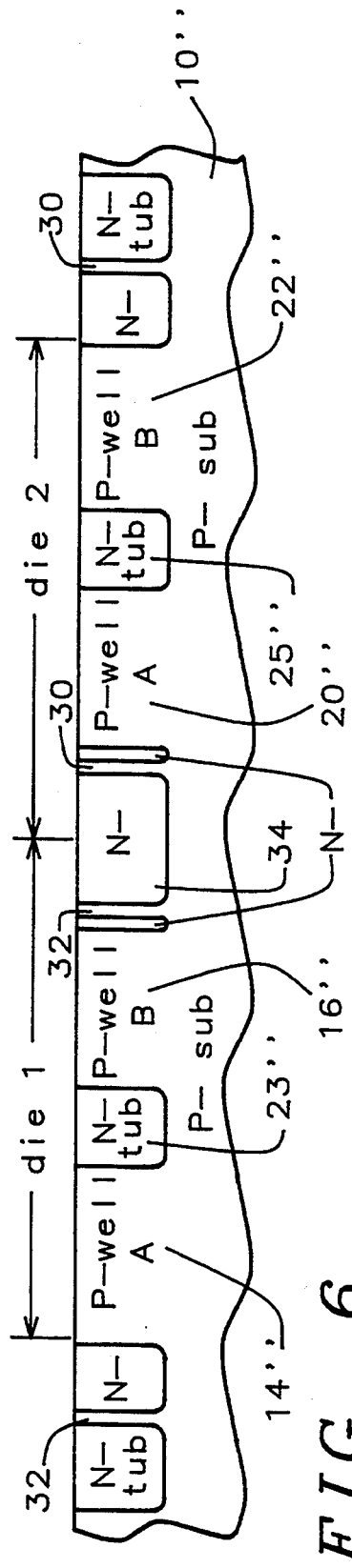

In accordance with this invention in FIGS. 5 and 6 one of a pair of P- well rings 30, 32 is shown to be added about the N- tubs 23" and 25" formed in P- sub 10" containing dies 1 and 2 in the configuration of FIGS. 3 and 4. As a result, the P- wells in each tub 23" and 25" are isolated by P- rings 30 and 32 (and the dies are separated by N- well 34) and the N- tubs are isolated, so the problem of shorting described in connection with FIGS. 3 and 4 has been overcome.

A process for forming guard rings 30 and 32 can be understood with reference to FIGS. 5 and 6. The guard rings 30 and 32 can be defined in the same layer (mask) as well. P- doped regions 14", 16", 20", and 22" for P- wells in substrate 10" with N- tubs 23", 25" are formed by ion implantation through a mask. Analogously to FIGS. 3 and 4, P- wells 18" and 24" are shown, as well. The chemical species of the P- dopant material implanted is boron with a dose of between about 1E12 $cm^{-2}$ and about 1E14 $cm^{-2}$, an energy of between about 40 keV and about 500 keV in a medium current implanter. At the end of the ion implantation, the mask is removed by the process of resist stripping either with a plasma of oxygen ($O_2$) and/or $H_2SO_4$ and $H_2O_2$. The N- dopant material employed for ion implantation is phosphorous (P) with a dose of 1E12 $cm^2$ and about 1E14 $cm^2$, an energy of between about 40 keV and about 500 keV.

Figure 7:
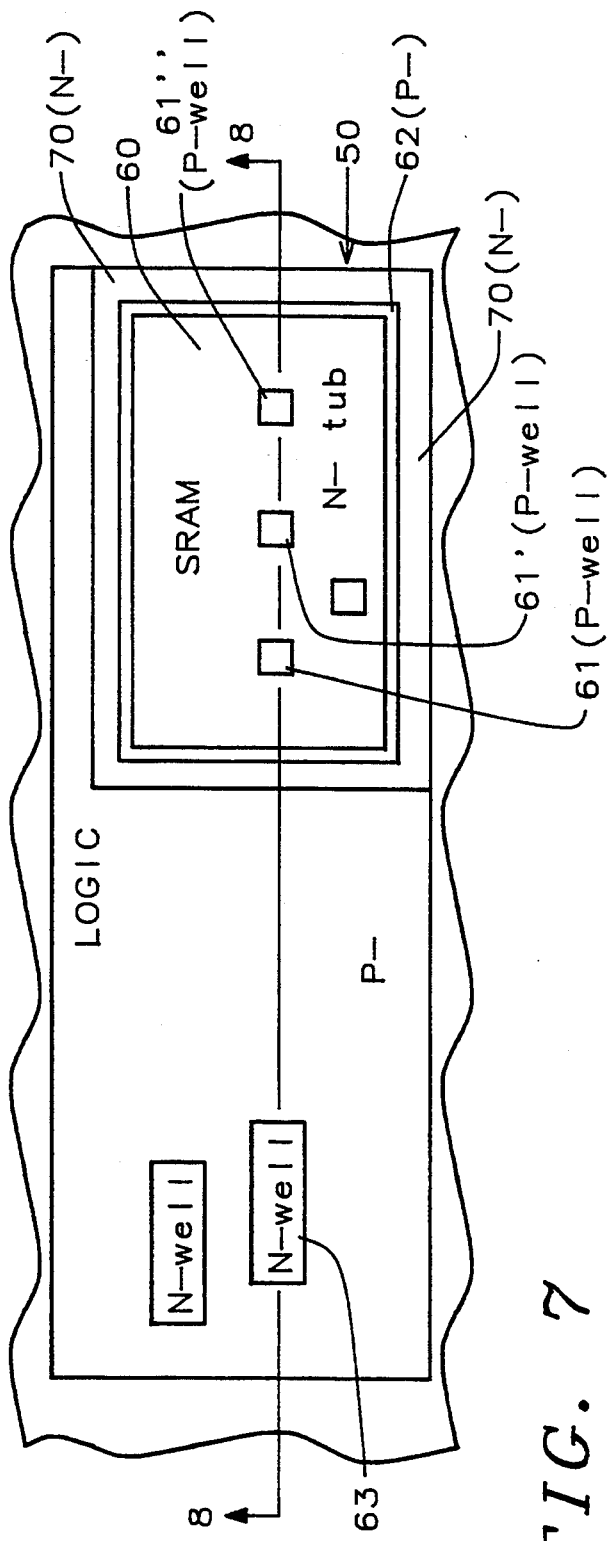
FIGS. 7 and 8 show a process for forming a guard ring to combine several different substrate dies into a chip.
Figure 8:
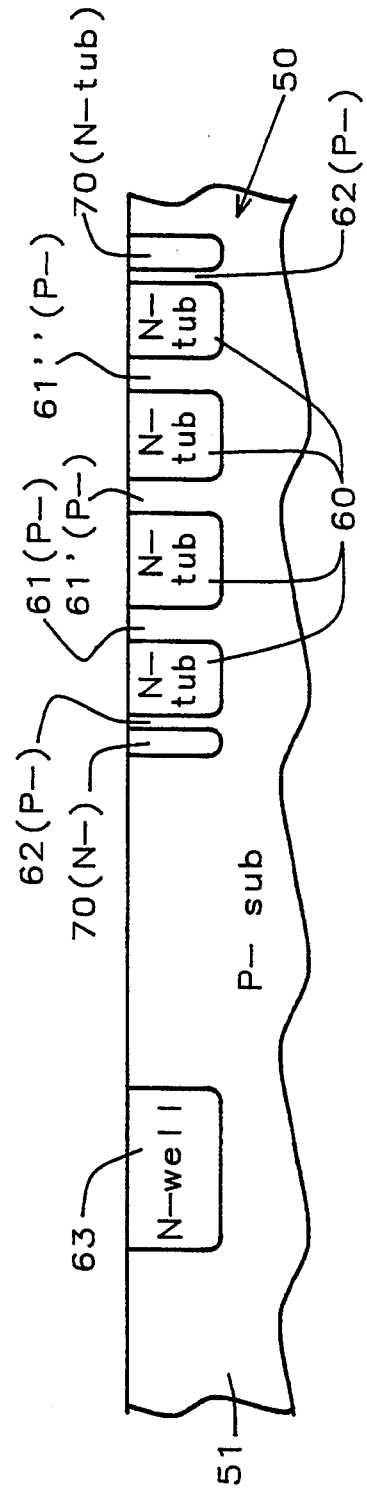

FIGS. 7 and 8 show how this invention can be applied to the manufacture of combined logic and SRAM regions on a single substrate. The SRAM 60 is formed in an N- tub 70 in a P- substrate 50. P- wells 61 are formed in the N- tub 70. A P- guard ring 62 is formed inside the margin of the N- tub 70. The tub 70 extends beyond the P- guard ring 62 at the margin.

This arrangement provides the advantage in manufacture that the arrangement of FIGS. 3, 4 shows that there is a failure when the well is switched from an N- substrate to a P- substrate. By using the designs of FIGS. 5–8, when one must change a given tub from one dopant material to the opposite, then the guard ring will prevent the failure which would otherwise be likely to occur. It should be understood that if the original substrate doping is opposite, then the doping ring should also be the opposite.

If a P- well in die is shorted to the N- substrate, then die 1 fails but die 2 is not shorted because each P- well is isolated.

FIGS. 7 and 8 show a process for forming a guard ring 62 to combine several different substrate dies into a chip. The P- doped regions 61, 61' and 61" in an N- tub 60 on semiconductor substrate 50 (with a P- sub region 51 in which the tube 60 is formed) comprise P- tubs and the region is framed by a guard ring 62 of P- material. A nearby N- well 63 is shown outside the guard ring 62 and outside the N- tub 60 in region 70 of tub 60. The processing conditions are the same as those employed above.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent as follows:

1. A method of manufacturing on a substrate a MOSFET device with a P or N type doping comprising the following steps:

forming a first mask with openings therein upon said substrate, implanting dopant material of a first P or N type to form tub areas in said substrate, implanting dopant material of the opposite type to form well areas and to form a guard ring surrounding a tub area, whereby a pattern of P and N type wells is formed in said substrate, and a guard ring of the same doping as said wells being formed in said substrate about said tub area, said guard ring protecting against short circuits when two doped areas of opposite types are juxtaposed in a single substrate.

2. The method of claim 1 wherein said guard rings are formed by ion implantation of a dopant material into said substrate.

3. The method of claim 1 wherein said dopant material of said first type implanted comprises boron.

4. The method of claim 3 wherein said implantation is performed with a dose of between about 1E12 cm$^{-2}$ and about 1E14 cm$^{-2}$, an energy of between about 40 keV and about 500 keV.

5. The method of claim 1 wherein said dopant material of said first type implanted comprises phosphorous.

6. The method of claim 5 wherein said implantation is performed with a dose of between about 1E12 cm$^{-2}$ and about 1E14 cm$^{-2}$, an energy of between about 40 keV and about 500 keV.

7. A method of manufacture on a substrate of a MOSFET device with an N type doping comprising implanting dopant material of a P type to form tub areas in said substrate, implanting dopant material of the N type to form wells in said P type tub areas, whereby a pattern of P and N type wells and tubs is formed in said substrate, and a guard ring of N type doping is formed protecting the wells within said tubs.

8. The method of claim 7 wherein said wells and said guard ring are formed by ion implantation of a dopant material into said substrate.

9. The method of claim 8 wherein said dopant material implanted in said tubs comprises boron.

10. The method of claim 9 wherein said implantation is performed with a dose of between about 1E12 cm$^{-2}$ and about 1E14 cm$^{-2}$, an energy of between about 40 keV and about 500 keV.

11. The method of claim 8 wherein said dopant material implanted for said wells and said guard rings is phosphorous.

12. The method of claim 11 wherein said implantation is performed with a dose of between about 1E12 cm$^{-2}$ and about 1E14 cm$^{-2}$, an energy of between about 40 and about 500 keV.

13. A method of manufacture on a substrate of a MOSFET device with an N type doping, forming a first mask with openings therein upon said substrate, implanting dopant material of an N type to form tub areas in said substrate, forming a second mask, with openings therein, over said openings in said first mask, removing said first mask, implanting dopant material of the P type into the openings in said second mask, whereby a pattern of P and N type wells and tubs is formed in said substrate, and a guard ring of a P type doping is formed protecting the wells within said tubs.

14. The method of claim 13 wherein said guard ring is formed by ion implantation of a dopant material into said substrate.

15. The method of claim 14 wherein said said dopant material implanted for said wells and said guard rings comprises boron.

16. The method of claim 15 wherein said implantation is performed with a dose of between about 1E12 cm$^{-2}$ and about 1E14 cm$^{-2}$, an energy of between about 40 and about 500 keV.

17. The method of claim 14 wherein said dopant material implanted in said tubs is phosphorous.

18. The method of claim 17 wherein said implantation is performed with a dose of between about 1E12 cm$^{-2}$ and about 1E14 cm$^{-2}$, an energy of between about 40 and about 500 keV.

* * * * *